United States Patent
Rodmacq et al.

(10) Patent No.: US 7,772,659 B2
(45) Date of Patent: Aug. 10, 2010

(54) MAGNETIC DEVICE HAVING PERPENDICULAR MAGNETIZATION AND INTERACTION COMPENSATING INTERLAYER

(75) Inventors: Bernard Rodmacq, Veurey Voroize (FR); Vincent Baltz, Bordeaux (FR); Alberto Bollero, Madrid (ES); Bernard Dieny, Lans En Vercors (FR)

(73) Assignees: Commissariat a l'Energie Atomique, Paris (FR); Centre National de la Recherche Scientifique, Paris (FR)

( * ) Notice: Subject to any disclaimer, the term of this patent is extended or adjusted under 35 U.S.C. 154(b) by 256 days.

(21) Appl. No.: 11/876,045

(22) Filed: Oct. 22, 2007

(65) Prior Publication Data
US 2008/0098167 A1 Apr. 24, 2008

Related U.S. Application Data (60) Provisional application No. 60/870,129, filed on Dec. 15, 2006.

(30) Foreign Application Priority Data

Oct. 23, 2006 (FR) .................................. 06 54448

(51) Int. Cl.
  *H01L 21/00* (2006.01)
  *H01L 29/82* (2006.01)
(52) U.S. Cl. ............... 257/421; 257/422; 257/425; 257/427; 257/428; 257/E21.663; 257/E21.665; 257/E29.167; 257/E29.168; 257/E43.004; 257/E43.005

(58) Field of Classification Search ........... 257/421, 257/422, 425, 427, 428, E21.663, E21.665, 257/E29.167, E29.168, E43.004, E43.005; 365/171, 173

See application file for complete search history.

(56) References Cited

U.S. PATENT DOCUMENTS

| 6,727,105 | B1 | 4/2004 | Brug et al. |
| 6,754,054 | B2 | 6/2004 | Seigler et al. |
| 6,815,082 | B2 * | 11/2004 | Girt ..................... 428/828.1 |
| 7,420,839 | B2 * | 9/2008 | Ikeda et al. ............. 365/173 |
| 7,514,162 | B2 * | 4/2009 | Berger et al. ........... 428/828.1 |
| 2004/0013880 | A1 | 1/2004 | Daughton et al. |

FOREIGN PATENT DOCUMENTS

| EP | 0 933 782 A2 | 8/1999 |
| FR | 2 859 306 | 3/2005 |
| JP | 8-321016 | 12/1996 |

* cited by examiner

*Primary Examiner*—Dao H Nguyen
(74) *Attorney, Agent, or Firm*—Burr & Brown (57) ABSTRACT

The magnetic device comprises a least two layers made of a magnetic material that are separated by at least one interlayer made of a non-magnetic material. The layers made of a magnetic material each have magnetization oriented substantially perpendicular to the plane of the layers. The layer of non-magnetic material induces an antiferromagnetic coupling field between the layers made of a magnetic material, the direction and amplitude of this field attenuating the effects of the ferromagnetic coupling field of magnetostatic origin that occurs between the magnetic layers.

12 Claims, 7 Drawing Sheets

MAGNETIC DEVICE HAVING PERPENDICULAR MAGNETIZATION AND INTERACTION COMPENSATING INTERLAYER

FIELD OF THE INVENTION

The present invention relates to the field of microstructures having magnetic properties. It deals with a magnetic device comprising thin magnetic layers with magnetization perpendicular to the plane of said layers and a non-magnetic interlayer that separates these magnetic layers.

Its potential applications include magnetic memories with multi-coercive fields or magnetic random access memories (MRAM), reprogrammable logic gates, spin valves or magnetic tunnel junctions that incorporate a magnetic device according to the invention.

BACKGROUND OF THE INVENTION

The use of magnetic devices comprising at least two layers made of a magnetic material separated by an interlayer made of a non-magnetic material is known in the field of magnetic memories and magnetic recording media. Generally speaking, these various layers and their interfaces are flat and parallel to each other.

In order to enhance the capabilities of such magnetic devices, attempts are made to make the structures of these memories increasingly compact. To achieve this, the magnetic devices use ferromagnetic layers that have ever smaller dimensions. In particular, these layers are becoming increasingly thinner and the stacks that form these magnetic devices are increasingly short and narrow.

By definition, the thickness or thinness of a layer is defined as the direction in which the various layers are stacked, i.e. the direction being perpendicular to the plane of the layers.

In the context of applications involving magnetic recording media or memories, it is important that each of the stacked magnetic layers is magnetically independent of the other magnetic layers.

If the magnetic device has layers that have large lateral dimensions, magnetic interactions (due to the magnetic field radiated by each of the magnetic layers) between the various layers that constitute the stack remain negligible.

However, if the magnetic structure is produced by using vapor deposition (techniques referred to as PVD, such as cathode sputtering for instance), magnetostatic charges may occur and build up at the level of the interfaces between the non-magnetic interlayer and each of the magnetic layers. The greater the surface roughness of the interfaces, the more numerous these magnetostatic charges will be.

In particular, if the non-magnetic layer has a constant thickness but has an average position that varies according to the direction in which the layers are stacked, the interlayer then has a "corrugated" shaped cross-section. The term "correlated roughness" is used in this case. If the interlayer has this kind of topology, the magnetic charges that occur induce a magnetic coupling field between the magnetic layers located either side of the non-magnetic interlayer.

In the case of magnetic layers with planar magnetization (that is when the direction of magnetization is parallel to the layer plane), it is known that this coupling field tends to align the magnetizations of the magnetic layers parallel to each other. The magnetic layers located either side of the non-magnetic interlayer are then no longer magnetically independent of each other. This coupling is generally referred to as Neel "orange-peel coupling" and, as a first approximation, does not depend on the lateral dimensions of the stack.

Moreover, when one miniaturizes the magnetic device by reducing the lateral dimensions of the stack down to just a few dozen or hundreds of nanometers, the fields radiated by each of the ferromagnetic layers, which are still assumed to have planar magnetization, create magnetostatic interaction between these layers.

Figure 1A:
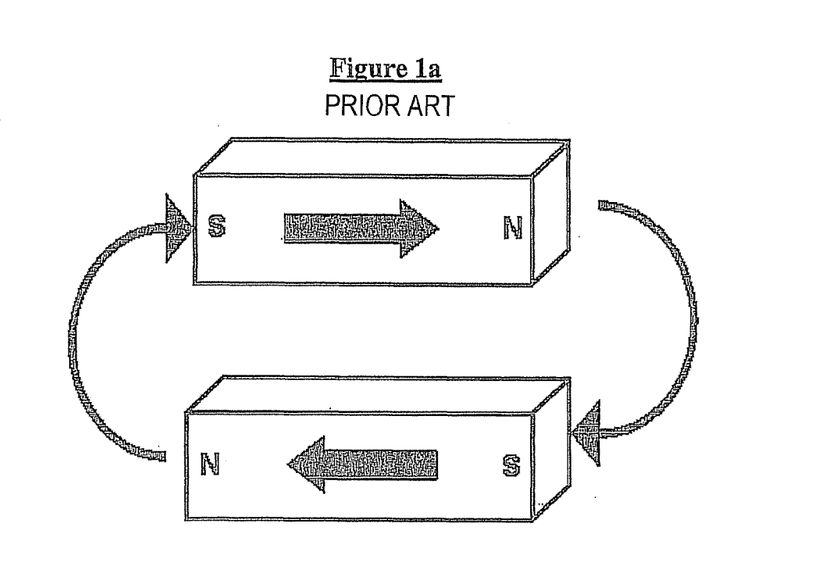
FIG. 1 is a schematic representation of the interaction between two bar magnets. This Figure has already been described in reference to the prior state of the art.

By analogy with two magnetized bars that attract each other when they are moved closer together, the South pole of the first bar is preferentially attracted to the North pole of the second bar and vice versa, as shown schematically in FIG. 1a. This magnetostatic interaction therefore tends to orientate the magnetizations of the magnetic layers in an antiparallel fashion.

Consequently, the effects of this magnetostatic interaction, the force of which depends on the lateral dimensions of the stack, are in opposition to the effects of the coupling field due to the correlated roughnesses of the interlayer, thanks to the opposite signs of the respective magnetostatic fields that are created.

Thus, by carefully adjusting the intensity of these two effects, and by deliberately modifying, for example, the roughness of the interlayer, it is possible to produce a relatively compact magnetic recording medium, the magnetic layers of which are virtually magnetically independent of each other. Documents U.S. Pat. No. 6,727,105 and US-A-2004/013880 describe magnetic recording media made in this way in which undesirable magnetic effects mutually compensate each other.

In contrast, as explained in Document FR-A-2 859 306, there is an obstacle to the miniaturization of magnetic media with planar magnetization which complicates or prevents information being written by currently available write heads. This is the superparamagnetic limit, i.e. the limit that corresponds to lateral sizes below which magnetization of the system no longer remains stable, typically for a period of ten years at ambient temperature.

As stated in Document FR-A-2 859 306, magnetic devices with layers having a magnetization orientation perpendicular to their plane have a superparamagnetic limit that diminishes as sizes drop because the demagnetizing field reduces with greater miniaturization of the magnetic device.

In addition, write heads are currently more efficient, in terms of field amplitude produced and spatial resolution, for perpendicular recording rather than for planar recording. This is why attempts are currently being made to develop recording media with layers having magnetization perpendicular to the plane of said magnetic layers.

Just like devices with planar magnetization, devices with magnetization perpendicular to the plane of their magnetic layers are also affected by ferromagnetic interaction associated with the correlated roughness of the interlayer. This ferromagnetic interaction therefore creates a ferromagnetic coupling field between the magnetic layers located either side of the non-magnetic interlayer.

If the lateral dimensions of the device with perpendicular magnetization are large, the fields radiated by the magnetic layers located on one side of the interlayer cause negligible interaction with the magnetic layers located on the other side. Nevertheless and in the same way as in the case of magnetic devices with planar magnetization, if the lateral dimensions of the stacked layers are reduced, the field radiated by one magnetic layer then causes non-negligible magnetostatic interaction with the other magnetic layers.

Figure 1B:
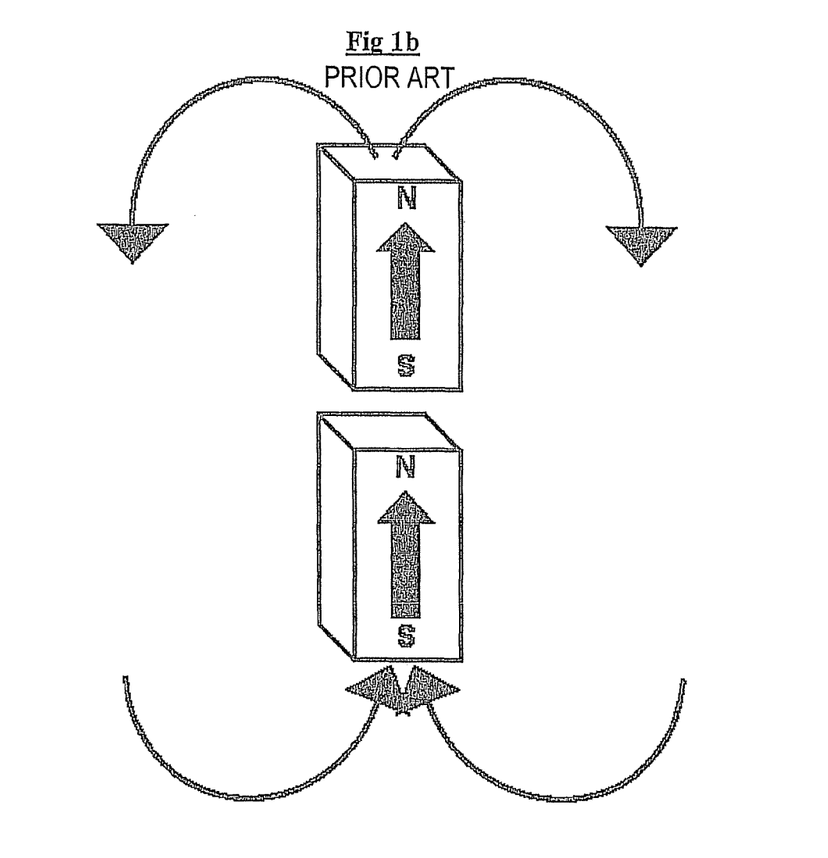

On the other hand, unlike devices with planar magnetization, the coupling field due to this magnetostatic interaction is ferromagnetic rather than antiferromagnetic, as shown schematically in FIG. 1b. Consequently, roughness interaction (orange-peel coupling) and magnetostatic interaction no longer compensate each other but are added to each other, so that the magnetic layers located either side of the interlayer can no longer be made magnetically independent of each other by these two forms of coupling cancelling each other out.

Figure 2:
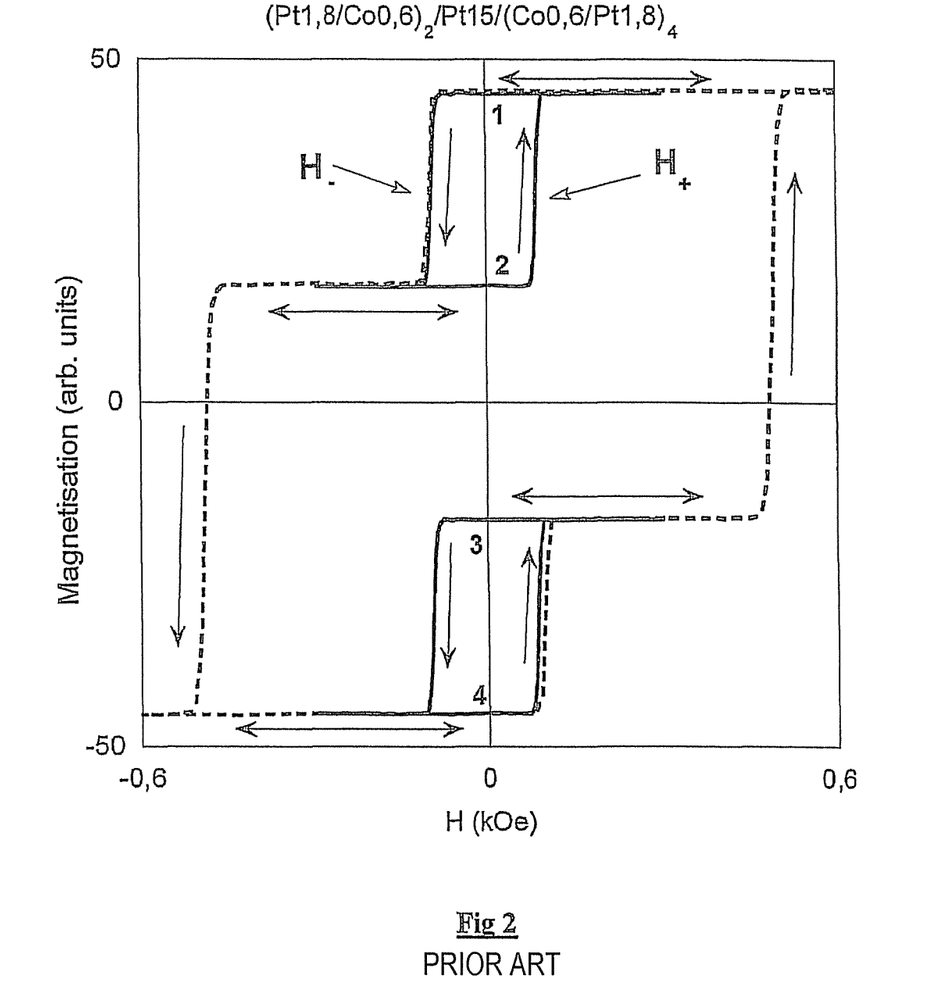
FIG. 2 is a schematic view of the magnetization curves of a magnetic device according to the prior art. This Figure has also already been described in reference to the prior state of the art.

FIG. 2 shows the magnetic hysteresis loops or magnetization curves of two multilayer magnetic structures having large lateral dimensions, i.e. structures between which there is hardly any magnetostatic interaction at all.

In this case, the stack that forms the magnetic device comprises two superposed multilayers made of cobalt and platinum, separated by a thick non-magnetic interlayer of platinum having the formula $(Pt_{1.8}/Co_{0.6})_2/Pt_{15}/(Co_{0.6}/Pt_{1.8})_4$. The numbers 1.8, 0.6 and 15 denote the thicknesses, in nanometers, of the chemically homogeneous layers (designated by their chemical elements) to which they are attached. Coefficients 2 and 4 denote the number of times the (Co/Pt) or (Pt/Co) multilayer pattern repeats either side of the interlayer.

For this stack, bearing in mind the small thickness of the layers used (in this example 1.8 and 0.6 nm for the platinum and cobalt), each multilayer can be regarded as a magnetically homogeneous layer. The use of these multilayers makes it possible to ensure that the magnetization of each of them is perpendicular to the plane of the layers, something which would not be the case, for example, in the case of a pure cobalt layer.

These (Co/Pt) multilayers could be replaced by any other material, alloy or multilayer that also has the property of magnetization perpendicular to its plane, and are merely used in order to illustrate the physical phenomena that are exploited. (Co/Pd) multilayers or chemically ordered alloys FePt or FePd could also be used, for example. Each of the two multilayers is referred to as a "magnetic layer" in the rest of this document.

Similarly, the nature of the interlayer is not confined to platinum and any other non-magnetic material, alloy or multilayer can be used, provided that this interlayer preserves the structural integrity of the stack and orientation of the magnetizations of the various magnetic layers perpendicular to their plane. Its thickness depends on the material used and will be chosen to ensure that any magnetic coupling between the two magnetic layers through this interlayer is far less intense than the coupling between the layers of cobalt inside each multilayer.

In the magnetic hysteresis loops shown in FIG. 2, the arrows indicate the direction of the magnetic hysteresis loop when magnetic excitation H indicated on the x-axis is applied. The unidirectional arrows represent irreversible loop changes and the bidirectional arrows represent reversible loop changes. The magnetization levels are indicated in arbitrary units on the y-axis.

The dotted line curves correspond to a so-called major magnetic hysteresis loop, i.e. a loop for which the amplitude of the variation in the magnetic excitation field is sufficient to successively reverse the magnetization direction of the two magnetic layers, whereas the curves shown a solid line correspondent to a so-called minor magnetic hysteresis loop in which the smaller amplitude of the applied magnetic field only results in reversal of the softer magnetic layer.

Magnetic "hardness" (or "softness") is defined in relation to the value of the magnetic field called the coercive field that it is required in order to reverse the magnetization of each of the magnetic layers. A particular magnetic layer will therefore be said to be "hard" if its coercive field is relatively high.

If $H_+$ and $H_-$ denote the reversal fields of the softer magnetic layer for applied increasing and decreasing magnetic fields respectively (see FIG. 2), the value of the coercive field of this layer is given by:

$$H_{c1} = |H_+ - H_-|/2$$

where the symbols || denote the absolute value of the difference in the reversal fields. Points 1 and 2 in FIG. 2 correspond to the situation where magnetization of the "harder" layer points upwards (positive magnetization), whereas that of the "softer" magnetic layer points either upwards (1) or downwards (2).

Similarly, points 3 and 4 correspond to the situation where magnetization of the "harder" layer points downwards (negative magnetization), whereas that of the "softer" magnetic layer points either upwards (3) or downwards (4). The coercive field of the softer magnetic layer can therefore also be determined, as above, when the magnetization of the "harder" magnetic layer is negative.

If the minor magnetic hysteresis loop is symmetrical relative to the zero magnetic field, $|H_+|=|H_-|$, indicating the magnetic independence of the two layers. In contrast, displacement of the so-called minor magnetic hysteresis loop relative to the zero magnetic field reveals interaction between the two magnetic layers through the non-magnetic interlayer, this displacement being either towards positive fields or negative fields, depending on the sign of the interaction.

Using the same definitions as those used above, this coupling field between the two magnetic layers $H_{cpl}$ can be calculated as follows:

$$H_{cpl} = (H_+ + H_-)/2$$

Interaction will be referred to as ferromagnetic if $H_{cpl}$ is negative (parallel magnetizations) and antiferromagnetic if $H_{cpl}$ is positive (antiparallel magnetizations).

In FIG. 2 one can see that the magnetic hysteresis loop of the softer magnetic layer is virtually centered relative to zero magnetic excitation fields (H=0 kOe). The slight offset of 5 Oe towards negative fields indicates the presence of slight surface roughness of the interfaces tending to stabilize parallel orientation of the magnetizations of the two layers, as was stated previously. If one ignores this ferromagnetic coupling which is weak compared to the values of the coercive fields, the two magnetic layers either side of the interlayer are therefore essentially magnetically independent of each other.

In a known manner, in the case, for instance, of applications involving storage memory type devices, when one uses two layers of different magnetic hardness either side of the interlayer, one can determine four stable states with a zero excitation field and this makes it possible to double the quantity of information stored compared with using only one magnetic layer, which has only two stable zero-field states.

The interlayer that separates the magnetic layers, in this example made of platinum, is relatively thick because it measures 15 nm. The compositions of each cobalt and platinum multilayer (layer thicknesses, number of repetitions of the basic Co/Pt pattern), result in coercive fields $H_{c1}$ and $H_{c2}$ of the two magnetic layers that have very different values.

As explained above, magnetostatic interaction between the magnetic layers is negligible in this case because the lateral dimensions of the stack are large and the interlayer is thick. There only remains the small above mentioned contribution made by the surface roughness of the interfaces.

A magnetic device comprising layers with perpendicular magnetization as defined above therefore has four magnetic stable zero-field states, i.e. when no magnetic field is applied to the device. These four magnetic states are, respectively, the up-up, up-down, down-up and down-down states and correspond to points 1, 2, 3 and 4 in FIG. 2.

If $M_1$ and $M_2$ denote the magnetizations of each of the two magnetic layers, with $M_2$ denoting, for example, magnetization of the magnetically harder layer, the resulting magnetization corresponding to each of these states will be $(M_2+M_1)$, $(M_2-M_1)$, $(-M_2+M_1)$ and $(-M_2-M_1)$ for states 1, 2, 3 and 4 in FIG. 2. It is apparent that only 3 distinctive states will be possible when $M_2=M_1$, because in this case states 2 and 3 will be equivalent in terms of total magnetization.

In order to achieve each of these four stable states, when $M_1$ is different to $M_2$, the magnetic device must be subjected to the following sequences of magnetic excitation fields (the numeric values stated correspond to the case envisaged in FIG. 2 and obviously depend on the values of the coercive fields $H_{c1}$ and $H_{c2}$ of the two magnetic layers and hence the particular structure of each of the magnetic layers):

for state 1, H=+0.6 kOe, then H=0 kOe;
for state 2, H=+0.6 kOe, then H=−0.3 kOe and finally H=0 kOe;
for state 3, H=−0.6 kOe, then H=+0.3 kOe and finally H=0 kOe;
for state 4, H=−0.6 kOe, then H=0 kOe;

The discussion above was based on a type of application referred to as "multi-coercive field magnetic storage" in which the four distinctive magnetization states make it possible to double the density of information stored compared with a conventional memory comprising a single magnetic layer that therefore only has two magnetizations states (up or down).

In another type of application, for instance non-volatile magnetic memories or reprogrammable logic gates, one uses stacks of magnetic tunnel junction type or spin-valve type layers that also consist of two magnetic layers separated by a non-magnetic metal or insulating layer intended to ensure magnetic independence of the two magnetic layers.

In this case, the memory state is read by measuring its electrical resistance by causing an electric current to flow in a direction that is perpendicular to the plane of the layers. This electrical resistance is higher when the magnetizations of the two layers are antiparallel rather than parallel. This phenomenon is referred to as "giant magnetoresistance" if the non-magnetic separating layer is metallic or as "tunnel magnetoresistance" if the non-magnetic separating layer is an insulator and, as is well-known in the literature, only depends on the relative orientation of the magnetization of the two layers.

In FIG. 2, states 1 and 4 are therefore impossible to discern, as are states 2 and 3, because they correspond to the same relative magnetization orientation (parallel for states 1 and 4, antiparallel for states 2 and 3). These states will be referred to as "degenerate states". In any application where the wanted signal is the electrical resistance of the stack (e.g. memories, logic gate), the information used is not the number of magnetic states but only the number of degenerate states, which is half as high.

It nevertheless remains true that, in order for such a memory or logic gate to function, it is still necessary that the two degenerate states (1, 4) and (2, 3) that correspond to parallel and antiparallel magnetization directions of the two magnetic layers respectively are both stable in a zero magnetic field, i.e. when the device is not subjected to any external magnetic field. Compared with the above discussion, it is therefore necessary that the coupling field between layers is strictly less than the coercive field of the "softer" magnetic layer.

Figure 3:
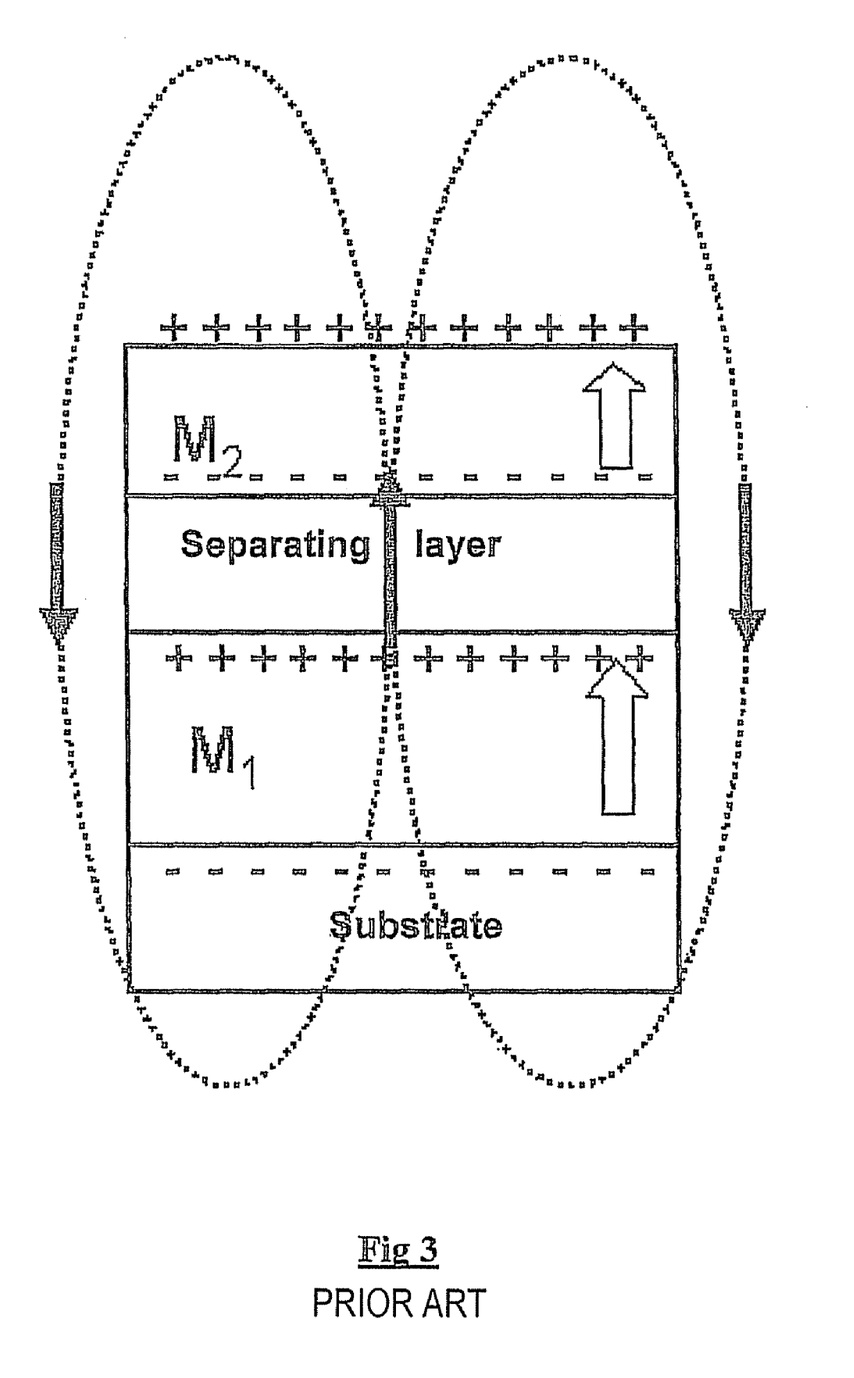
FIG. 3 is a schematic view of two stacked magnetic layers separated by a non-magnetic interlayer. This Figure has also already been described in reference to the prior state of the art.

FIG. 3 is a schematic representation of two magnetic layers with magnetization perpendicular to their plane, separated by a non-magnetic layer. $M_1$ and $M_2$ are the magnetizations of the two layers, the outline arrows represent the direction of the magnetizations of these layers and the solid arrows schematically show the magnetic fields radiated from one layer to the other and tending to align the magnetizations of the two magnetic layers parallel to each other. Reducing the lateral dimensions causes positive and negative magnetostatic charges to appear at the interfaces of the magnetic layers, giving rise to magnetostatic coupling that encourages parallel alignment of the magnetizations of the two magnetic layers.

Figure 4:
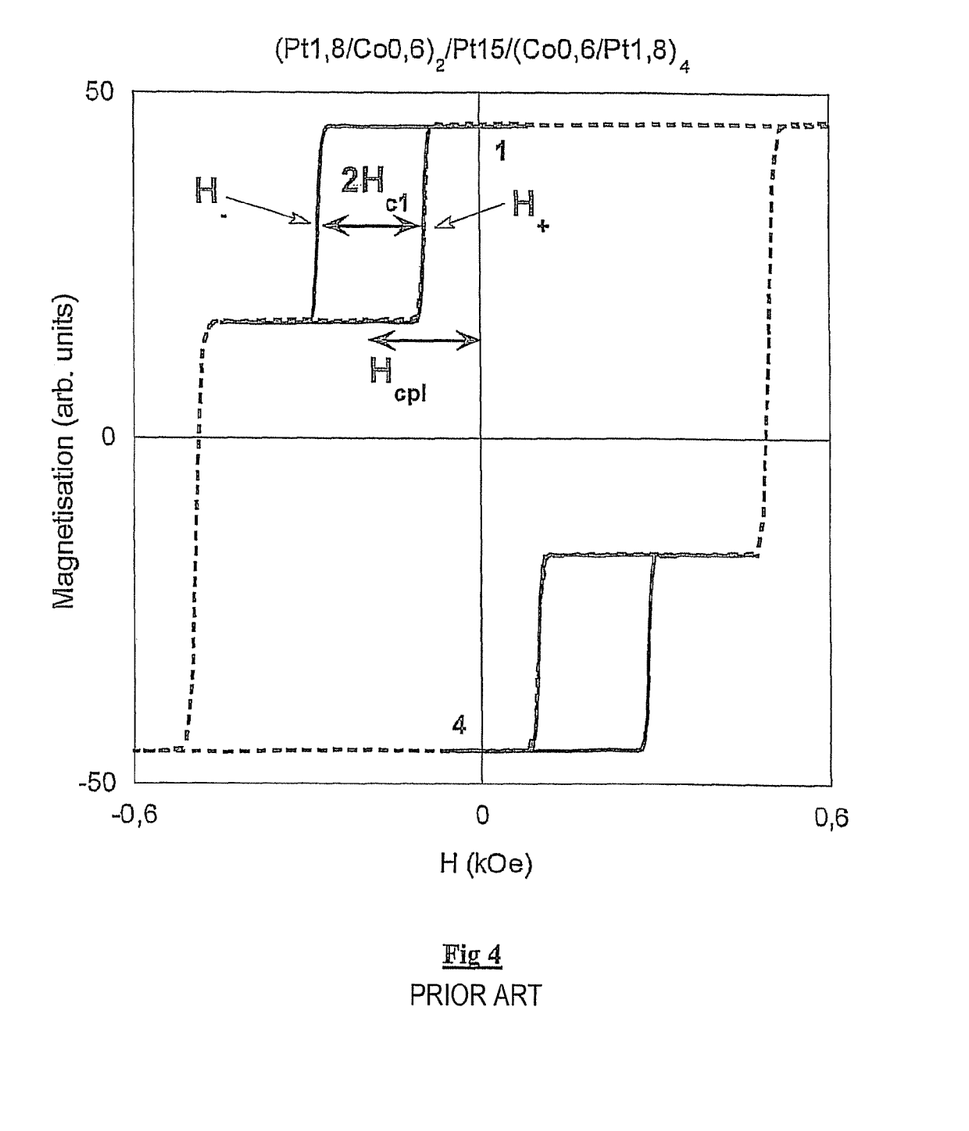
FIG. 4 is a schematic view of the magnetization curves of a magnetic device according to the prior art. This Figure has also already been described in reference to the prior state of the art.

FIG. 4 illustrates the effect of reducing the lateral dimensions of a magnetic device such as that described in relation to FIG. 3 on the curve that shows the variation in magnetization as a function of the applied magnetic field. In this case, as explained above, a ferromagnetic type coupling field appears between the magnetic layers located either side of the interlayer due to the effect of magnetostatic interaction.

Consequently, as shown in FIG. 4, the magnetization curve of the softer magnetic layer (continuous line) is displaced relative to the zero magnetic field on the y-axis towards negative magnetic fields. The magnetizations of the two layers tend to remain parallel to each other as long as possible due to the effect of this ferromagnetic coupling. It will then be necessary to apply a magnetic field H_ having a greater amplitude than in the case of FIG. 2 (equal to the total of coercive field $H_{c1}$ and coupling field $H_{cpl}$) in order to reverse the magnetization of the soft layer.

Moreover, if the ferromagnetic coupling field that causes this displacement exceeds coercive field $H_{c1}$ of the softer magnetic layer, as is the case in FIG. 4, the intermediate up-down and down-up states (points 2 and 3 in FIG. 2) will no longer be stable in a zero magnetic field. As is evident from FIG. 4, only the two extreme up-up and down-down states that correspond to points 1 and 4 respectively are capable of being stable once one ceases to subject the magnetic device to an excitation field such as that generated by a write head.

Consequently, using such a magnetic recording medium, the quantity of information that can be recorded is halved compared with the device described in relation to FIG. 2.

Because such a stack has two magnetic states that are stable in a zero field (up-up and down-down) that both correspond to the same relative orientation of the magnetizations of the two magnetic layers, it has no functional application for devices such as non-volatile memories or logic gates because the only state that is stable in a zero magnetic field will be a degenerate state that corresponds to the situation where the magnetizations are parallel (low-resistance state).

It will nevertheless be possible to access the antiparallel state (high resistance) by means of a magnetic field pulse, but this state will not be maintained once the magnetic field pulse has decayed and non-volatility will be lost.

SUMMARY OF THE INVENTION

The object of the present invention is to propose a magnetic device with magnetic layers that have magnetization perpendicular to the plane of these layers and in which the coupling field between these magnetic layers located either side of a non-magnetic layer remains weaker than the coercive field of the softer magnetic layer.

The present invention therefore relates to a magnetic device comprising at least two layers made of magnetic materials separated by at least one interlayer made of a non-magnetic material.

According to the invention, the layers made of magnetic materials each have magnetization oriented substantially perpendicular to the plane of the layers. In addition, the layer made of a non-magnetic material is capable of inducing, depending on the material in question and its thickness, an antiferromagnetic coupling field between these layers made of magnetic materials so as to attenuate the effects of the ferromagnetic coupling field produced between them if the interfaces either side of the separating layer have a certain surface roughness and/or if the lateral dimensions of the device are reduced.

In other words, the antiferromagnetic coupling effects oppose the ferromagnetic interaction that occurs between the magnetic layers. Thus, if the amplitude of this additional coupling field is well chosen, it makes the layers made of a magnetic material located either side of the interlayer virtually or completely magnetically independent of each other. Different magnetic interactions therefore cancel each other out.

In practice, this interlayer consists of a material selected from the group comprising ruthenium (Ru), chrome (Cr), gold (Au), silver (Ag), vanadium (V), niobium (Nb) or even an insulating alloy chosen from the group comprising silicon, magnesium, zirconium, titanium, tantalum, chrome, ruthenium or aluminum oxides or, more generally speaking, any material regarded in the literature as being capable of inducing an antiferromagnetic coupling field having an amplitude, as a function of the thickness of this non-magnetic layer, that can be set to a value of the same order of magnitude as the amplitude of the magnetostatic coupling field, thus achieving said magnetic independence.

In practice, the interlayer may have a thickness of 0.2 nm to 10 nm.

The term "thickness" is taken to mean the dimension in the direction in which the various layers are stacked, i.e. the direction perpendicular to the plane of the layers. An interlayer structured in this way will encourage antiferromagnetic coupling capable of compensating all or part of the ferromagnetic coupling that occurs between the magnetic layers located either side of such an interlayer.

In practice, if the lateral dimensions of this magnetic device, defined in a plane parallel to the plane of the layers, are typically less than 10 µm, the ferromagnetic coupling field that exists between the magnetic layers is relatively intense, but it can be compensated by the antiferromagnetic coupling field induced through the interlayer made of a non-magnetic material.

According to one embodiment of the invention, the resultant of the ferromagnetic and antiferromagnetic coupling fields can be less intense than the coercive field of the softer magnetic layer.

In other words, the magnetization curves of the hard and soft magnetic layers are not displaced excessively, so the magnetic device still has four stable states when it is subjected to a zero excitation field.

Practically speaking, the intensity of the antiferromagnetic coupling field may compensate, at least partially, the intensity of the ferromagnetic coupling field resulting from magnetostatic interaction between layers made of magnetic materials as well as ferromagnetic interaction occurring at the level of said interfaces, so that the resultant of these coupling fields is weaker than the coercive field of the soft magnetic layer.

One therefore achieves at least partial mutual compensation of the effects produced by the various fields, interactions due to surface roughness and the smallness of the lateral dimensions. The antiferromagnetic coupling thus determined makes it possible to substantially attenuate the effects of ferromagnetic coupling due to interaction between magnetic layers and render the two states of relative magnetization orientation (parallel and antiparallel) stable in the absence of an external magnetic field.

According to another practical embodiment of the invention, the intensity and orientation of this antiferromagnetic coupling field may compensate, almost precisely, the intensity of the ferromagnetic coupling field resulting from magnetostatic interaction, the coupling field resulting from such compensation being at least 10 times weaker than the coercive field of the soft magnetic layer.

The antiferromagnetic coupling thus determined makes it possible to overcome the ferromagnetic coupling effects between magnetic layers, and this makes the magnetic layers located either side of the non-magnetic interlayer completely magnetically independent.

According to one particular embodiment of the invention, the layers made of a magnetic material may comprise a plurality of layers formed firstly from an alloy consisting of a material selected from the group comprising iron, cobalt and nickel and, secondly, a material selected from the group comprising platinum, palladium, copper or one or more elements belonging to the lanthanide series or the magnetic transition metals group, having magnetizations that are oriented substantially perpendicular to the plane of the layers.

Magnetic layers structured in this way have coercive fields that are sufficiently weak for the magnetic device to be sensitive to magnetic excitation fields that are currently achievable but also sufficiently high to have stable states for weak or zero excitation fields.

In practice, an additional layer can be inserted between the interlayer and at least one of the layers of magnetic material, this layer being thin, typically having a thickness of less than 1 nm, and consisting of a material such as platinum or palladium capable of enhancing the perpendicular magnetic anisotropy of said layers made of a magnetic material.

According to one particular embodiment of the invention, the magnetic device may comprise multilayers formed by four layers and two layers respectively of magnetic materials either side of said layer of non-magnetic material, the magnetic layers having different magnetic hardnesses so that the remanent magnetizations of the layers made of magnetic materials have four stable states in a zero excitation field, up-up, up-down, down-up and down-down respectively.

Such a magnetic device therefore has at least four stable states in a zero excitation field because the magnetic multilayers located either side of the non-magnetic interlayer are magnetically mutually independent.

According to one practical implementation of this particular embodiment of the invention, the successive layers of the magnetic device may consist of:
- an alternating sequence of four 1.8 nm platinum layers associated with four 0.6 nm cobalt layers,
- a non-magnetic 1 nm ruthenium layer,
- an alternating sequence of two 0.6 nm cobalt layers associated with two 1.8 nm platinum layers.

Also, the present invention relates to a random-access magnetic memory, a magnetic recording medium with a multi-coercive field or a reprogrammable logic gate comprising a magnetic device as described above.

Such devices can therefore be extremely compact which allows them to be miniaturized compared to similar devices according to the prior art without their operation being disrupted by magnetostatic fields resulting from such reduction in size or surface roughness of interfaces. In addition, the stable states of the magnetization loops of the magnetic layers have enhanced stability and this makes these devices less sensitive to common magnetic disturbances.

BRIEF DESCRIPTION OF THE DRAWINGS

The way in which the invention may be implemented and its resulting advantages will be made more readily understandable by the descriptions of the following embodiments, given merely by way of example, reference being made to the accompanying drawings.

DETAILED DESCRIPTION OF THE INVENTION

Among the types of magnetic interactions mentioned above, research has revealed, in particular, a type of coupling that occurs between two thin magnetic layers separated by a non-magnetic metallic interlayer (*Systematic variation of the strength and oscillation period of indirect magnetic exchange coupling through the 3d, 4d, and 5d transition metals*, S. S. P. Parkin et al, Physical Review Letters 67, 3598-3601 (1991)). This involves RKKY coupling (named after researchers Ruderman, Kittel, Kasuya and Yosida).

This RKKY coupling is capable of encouraging parallel alignment or antiparallel alignment of the magnetizations of magnetic layers located either side of the interlayer, depending on the nature and the thickness of the latter. The alignment of these magnetizations is determined by the nature of the non-magnetic metallic material and by its thickness, which must nevertheless remain small. In addition, this RKKY coupling is essentially non-dependent on the lateral dimensions of the stacked layers.

Another type of indirect antiferromagnetic coupling has also been revealed for a separating layer based on a metal oxide. This applies, in particular, to magnetic tunnel junctions based on magnesium oxide MgO (*Interlayer magnetic coupling interactions of two ferromagnetic layers by spin polarized tunneling*, J. Faure-Vincent et al, Physical Review Letters, Vol. 89, No. 10, 107206 (2002)).

Figure 5:
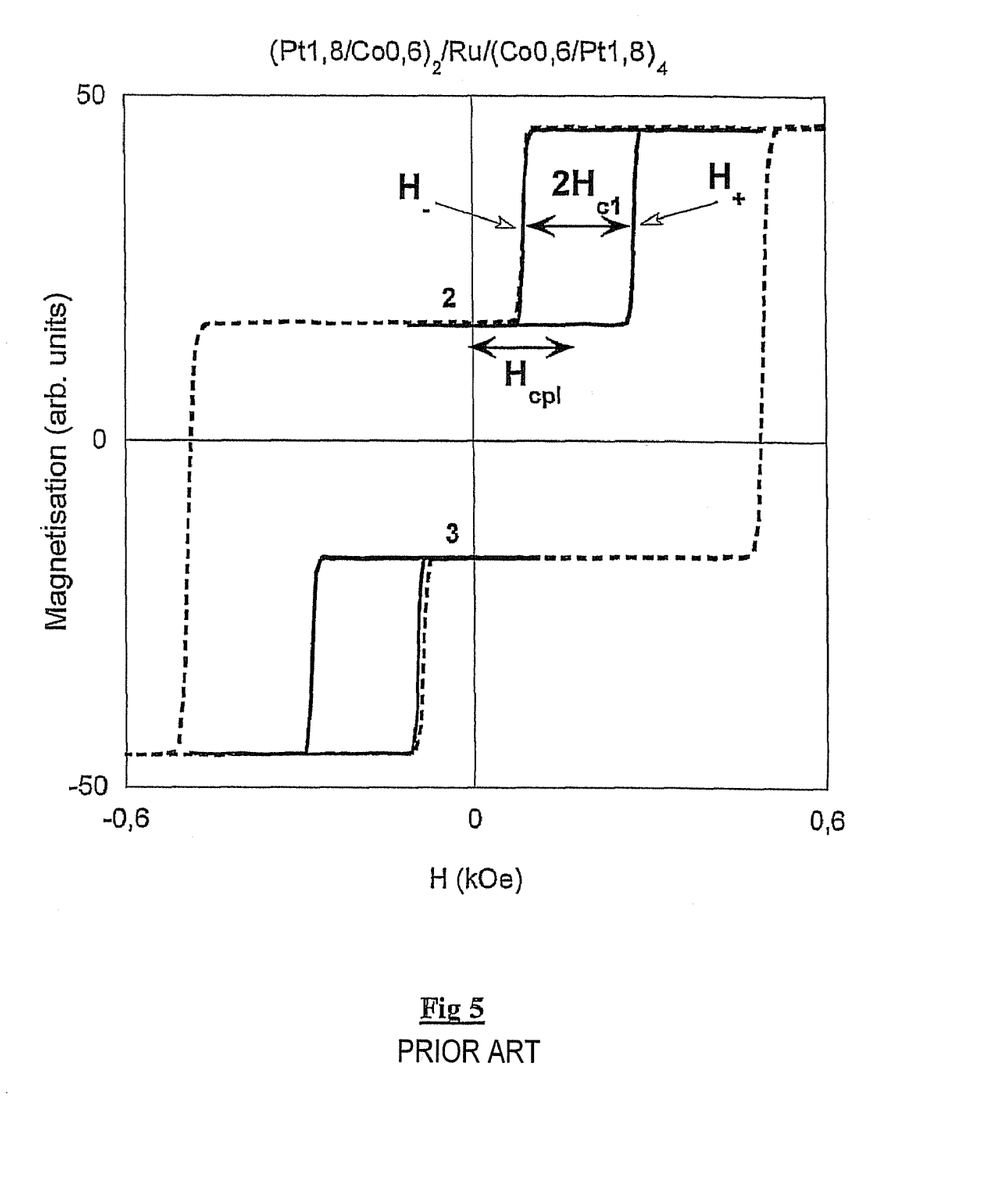
FIG. 5 is a schematic view of the magnetization curves of a magnetic device having large lateral dimensions.

FIG. 5 shows the magnetization curves that can be observed in the case of a magnetic device having large lateral dimensions. This magnetic device consists of two stacked magnetic layers comparable to those that constitute the stack described in relation to FIG. 2. In contrast, the material from which the non-magnetic interlayer that separates these magnetic multilayers is made and its thickness are selected so as to produce an antiferromagnetic coupling field between these magnetic layers, in this case a 1 nm thick ruthenium layer.

The distinctive stack of this device with magnetic layers therefore consists of:
  an alternating sequence of four 1.8 nm platinum layers associated with four 0.6 nm cobalt layers,
  a 1 nm non-magnetic ruthenium layer,
  an alternating sequence of two 0.6 nm cobalt layers associated with two 1.8 nm platinum layers.

In addition, if the lateral dimensions of this magnetic device are sufficiently large, the total of the magnetostatic coupling field due to the field radiated by the layers and the ferromagnetic coupling field induced by surface roughness at the interface will be negligible (several orders of magnitude less) compared to the value of the antiferromagnetic coupling field. This will cause the magnetization curves of the soft magnetic layer to be displaced towards more positive magnetic field values (continuous line in FIG. 5).

Thus, in contrast to the case shown in FIG. 4, the magnetizations of the two magnetic layers located either side of the interlayer tend to remain antiparallel to each other as long as possible because this magnetic state is encouraged by the predominance of antiferromagnetic coupling. Reversal of the magnetization of the soft layer will then be produced by an applied magnetic field that is weaker than that in the case of FIG. 2 (in fact the difference between coercive field $H_{c1}$ and coupling field $H_{cp1}$).

If the magnetic device structured in this way is used to form a multi-coercive field recording medium, the stable storage states in a zero field are, as shown in FIG. 5, the up-down and down-up (points 2 and 3), whereas the extreme up-up and down-down states (points 1 and 4) are no longer stable when the magnetic device is subjected to a zero excitation field. By analogy and for "non-volatile memory" or "logic gate" type applications, the only stable state in a zero field is then, in contrast to the case described in relation to FIG. 4, the state in which the magnetizations are antiparallel (high-resistance state).

Figure 6:
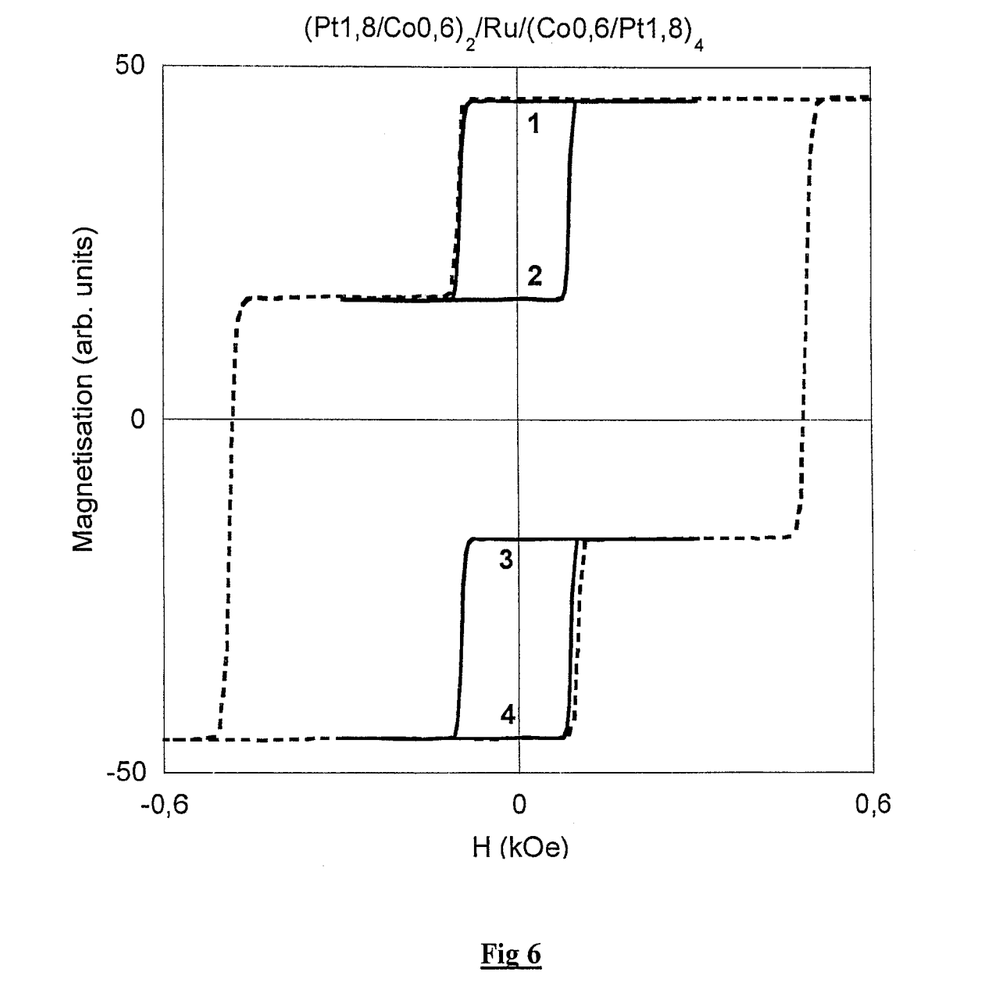
FIG. 6 is a schematic view of the magnetization curves of a magnetic device according to the present invention.

On the other hand, the magnetic device in accordance with the invention shown in FIG. 6, has four stable states in a zero magnetic field. Its stack structure is similar to that of the device, the magnetic hysteresis loop of which is shown in FIG. 5. However, the magnetic device shown in FIG. 6 has reduced lateral dimensions in accordance with one embodiment of the invention, so that magnetostatic interaction, as well as interaction due to surface roughness, cause a ferromagnetic coupling field between the magnetic multilayer structures located either side of the non-magnetic interlayer.

In this case, the effects of the antiferromagnetic coupling field due to the ruthenium interlayer and the effects of this ferromagnetic coupling field cancel each other out and this "re-centers" the magnetization loop of the soft magnetic layer. The term "re-centers" is used to denote displacement of the magnetic hysteresis loop to a position that is symmetrical relative to the zero magnetic field (H=0 kOe).

Consequently, the two extreme states (points 1 and 4) are once again stable in a zero excitation field. The two intermediate states (points 2 and 3) remain stable, so that this magnetic device has four stable states (1, 2, 3 and 4) when it is not subjected to any excitation field.

Only degenerate states are relevant for "non-volatile memory" or "logic gate" type applications. One therefore re-stabilizes, in a zero magnetic field, the two degenerate states (1, 4) and (2, 3) that correspond respectively to parallel and antiparallel magnetization directions of the two magnetic layers.

Such a magnetic device thus has the advantage of being extremely compact and relatively insensitive to magnetic disturbances. In addition, since the magnetization of the magnetic layers is perpendicular to the plane of the layers, it becomes possible to miniaturize the device down to dimensions that are smaller than the potential limiting dimensions of structures with planar magnetization. In fact, in the case of layers with perpendicular magnetization, the superparamagnetic limit is pushed back towards smaller dimensions compared with systems that use layers with planar magnetization.

Given these facts, it should be noted that it is possible to obtain considerable variety in terms of the structures of magnetic devices according to the invention. Choosing appropriate characteristics of the magnetic device then depends on the desired application and performance.

Figure 7:
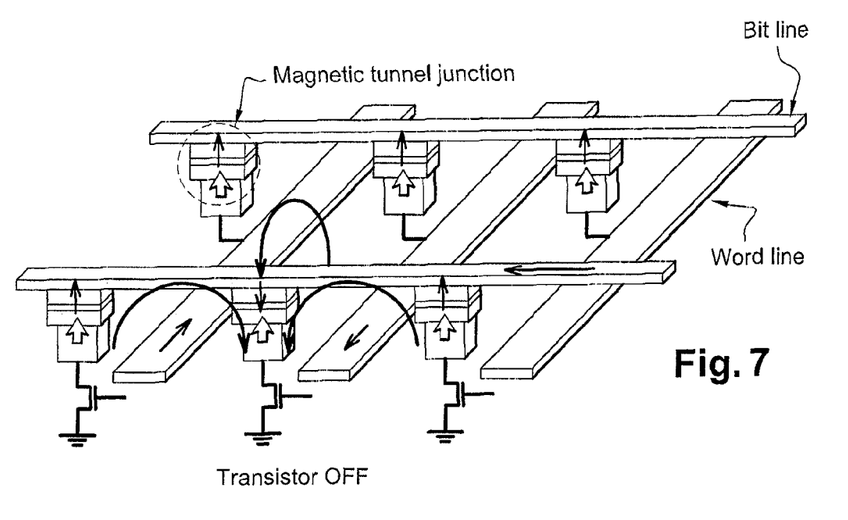
FIG. 7 is a schematic view of an assembly of 6 MRAM cells in accordance with the present invention.

Thus, for example, FIG. 7 schematically shows an assembly of 6 MRAM cells in accordance with the invention. The composition of magnetic tunnel junctions is typically PtMn/Co/(Pt 1.5 nm/Co 0.6 nm)$_4$/MgO 0.7 nm/(Co 0.6 nm/Pt 1.5 nm)$_2$. The magnetizations of the two multilayers (Co/Pt) are oriented perpendicular relative to the plane of the layers. The thickness of the MgO oxide barrier is chosen so that there is antiparallel coupling between the magnetizations of the two magnetic multilayers, this coupling compensating the magnetostatic coupling between these two multilayers.

The magnetization of the lower electrode (reference layer) may advantageously be anchored by an adjacent antiferromagnetic layer, for example one made of PtMn. The magnetization of the upper multilayer (storage layer) may be oriented either upwards or downwards. The tunnel junction has two different electrical resistance levels, depending whether the magnetizations of the two multilayers are parallel or antiparallel (tunnel magnetoresistance).

Data is written by combining three current pulses: 1) An electric current pulse in the bit line located above the addressed junction, this pulse generates a field parallel to the plane of the layers at the level of the storage layer, 2) and 3) two current pulses in opposite directions in the two word lines located either side of the junction in order to generate an out-of-plane field-upwards or downwards, depending on the direction of the current in these two lines. In the same way as for the Stoner-Wolfarth asteroid, combining the planar field and the out-of-plane field makes it possible to obtain write selectivity in this type of memory.

Data is read by turning on the select transistor connected in series with the addressed junction. The current flowing through the junction makes it possible to determine the latter's electrical resistance level and deduce the magnetic configuration of the junction from this.

Relatively straightforward experiments can be used to prepare nomograms that make it easier to select parameters (materials, thicknesses and lateral dimensions) that govern the implementation of a magnetic device in accordance with the invention.

Figure 8:
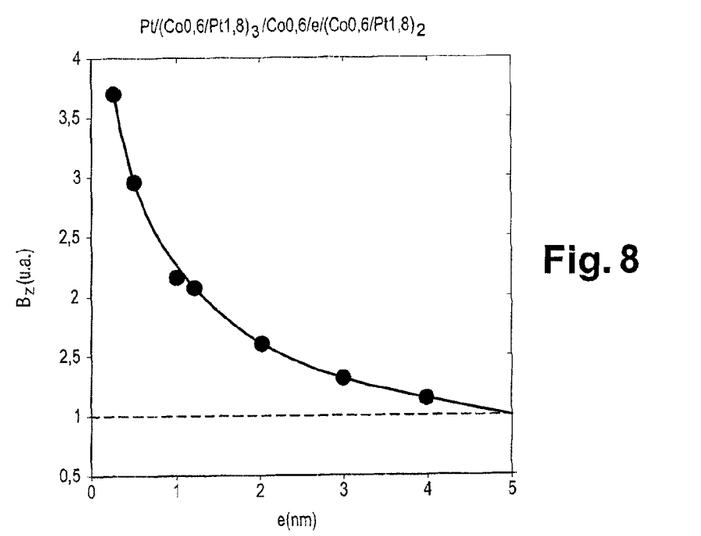
FIG. 8 is a graph showing changes in the field radiated by the magnetically hard layer onto the magnetically soft layer as a function of the thickness of the non-magnetic interlayer.

For example, the diagram in FIG. 8 shows, for cubic magnetic cells having lateral dimensions of 100 nm by 100 nm, changes in the field $B_z$ (in the direction perpendicular to the plane of the layers) radiated by the hard magnetic layer onto the soft magnetic layer as a function of thickness e of the non-magnetic interlayer that separates the hard and soft layers.

In this case the material from which the interlayer is made is ruthenium and its thickness e varies from 0.2 nm to 5 nm. As the curve in FIG. 7 shows, the field $B_z$ radiated between layers, i.e. the ferromagnetic coupling field, increases approximately hyperbolically when one reduces interlayer thickness e. In our case, the radiated field is expressed in arbitrary units and is normalized to a value of 1 for a thickness of 5 nm.

Similarly, one can measure variation in the value of the indirect coupling field as a function of thickness e of the interlayer. Then, by superimposing the two curves obtained, one can determine the optimum thickness at which the ferromagnetic and antiferromagnetic fields compensate each other, thus cancelling out coupling between the magnetic layers which then become magnetically independent.

Conventional techniques for fabricating stacked magnetic and non-magnetic layers can be used in order to produce a magnetic device in accordance with the present invention. One can use cathode sputtering or vapor deposition in order to obtain deposition of the various layers. Epitaxy can also be used to grow some of the layers that constitute the multilayers.

Other methods of implementing the invention are possible without thereby extending beyond the scope of this invention.

The invention claimed is:

1. A magnetic device of reduced lateral dimensions comprising a least two layers made of magnetic material separated by at least one interlayer made of non-magnetic material,
   said layers made of magnetic material each have magnetization oriented substantially perpendicular to the plane of said layers;
   said layer made of non-magnetic material induces an antiferromagnetic coupling field between said layers made of magnetic material, the direction and amplitude of this field attenuating the effects of the ferromagnetic coupling field of magnetostatic origin that occurs between said layers made of magnetic material, wherein the resultant of said ferromagnetic and antiferromagnetic coupling fields is weaker than the weaker of the coercive fields of the layers made of magnetic material in order that the two relative magnetization orientations of the magnetic layers, parallel and antiparallel, are stable in the absence of any external magnetic field; and
   the material of said layer made of non-magnetic material is selected from the group consisting of ruthenium, chrome, gold, silver, vanadium and niobium, or an insulating alloy selected from the group consisting of magnesium oxide, zirconium oxide, titanium oxide, tantalum oxide, chrome oxide and ruthenium oxide, which induces the antiferromagnetic coupling field that produces magnetic independence between said layers made of magnetic material.

2. A magnetic device as claimed in claim 1, wherein the lateral dimensions of the magnetic device defined in a plane parallel to the plane of the layers are less than 10 μm.

3. A magnetic device as claimed in claim 1, wherein the resultant of said ferromagnetic and antiferromagnetic coupling fields is at least ten times weaker than the weaker of the coercive fields of the layers made of magnetic material.

4. A magnetic device as claimed in claim 1, wherein the interlayer of non-magnetic material has a thickness of 0.2 nm to 10 nm.

5. A magnetic device as claimed in claim 1, wherein the layers made of magnetic material comprise, firstly, a pure element, an alloy or a plurality of layers consisting of a material selected from the group consisting of iron, cobalt and nickel and, secondly, a material selected from the group consisting of platinum, palladium, copper or an element belonging to the lanthanide series or magnetic transition metals group so as to obtain magnetization oriented substantially perpendicular to the plane of the layers.

6. A magnetic device as claimed in claim 1, wherein an additional layer is inserted between the interlayer and at least one of said layers made of magnetic material, said layer consisting of platinum or palladium capable of enhancing the perpendicular magnetic anisotropy of said layers made of magnetic material.

7. A magnetic device as claimed in claim 1, wherein the layers made of magnetic material have different total magnetizations and different magnetic hardnesses so that the remanent magnetizations of said layers made of magnetic material have four stable states in a zero excitation field, up-up, up-down, down-up and down-down respectively.

8. A magnetic device as claimed in claim 7, wherein successive layers thereof consist of:

a magnetic platinum/cobalt multilayer having the general form $(Pt/Co)_n$,
a non-magnetic ruthenium layer of about 1 nm in thickness,
a magnetic cobalt/platinum multilayer having the general form $(Co/Pt)_m$, the number of repetitions n and m being different.

9. A multi-coercive field magnetic recording medium, comprising the magnetic device as claimed in claim 1.

10. A spin valve or magnetic tunnel junction, comprising the magnetic device as claimed in claim 1.

11. A random-access magnetic memory, comprising the magnetic device as claimed in claim 10.

12. A reprogrammable logic gate, comprising the magnetic device as claimed in claim 10.

* * * * *